United States Patent
Clinton et al.

(10) Patent No.: US 6,330,697 B1
(45) Date of Patent: Dec. 11, 2001

(54) APPARATUS AND METHOD FOR PERFORMING A DEFECT LEAKAGE SCREEN TEST FOR MEMORY DEVICES

(75) Inventors: Michael P. Clinton, Essex Junction, VT (US); Klaus G. F. Enk, Hsinchu (TW); Russell J. Houghton, Essex Junction, VT (US); Alan D. Norris, Hinesburg, VT (US); Josef T. Schnell, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/294,866

(22) Filed: Apr. 20, 1999

(51) Int. Cl.[7] .................................................. G11C 29/00
(52) U.S. Cl. ............................ 714/721; 714/719; 714/723
(58) Field of Search ...................................... 714/718, 721, 714/722, 723

(56) References Cited

U.S. PATENT DOCUMENTS

| | | | |
|---|---|---|---|
| 3,795,859 | * 3/1974 | Benante et al. | 714/721 |
| 4,595,875 | * 6/1986 | Chan et al. | 324/522 |
| 4,713,815 | 12/1987 | Bryan et al. . | |
| 4,800,332 | * 1/1989 | Hutchins | 324/73.1 |
| 4,835,458 | * 5/1989 | Kim | 324/73.1 |
| 4,841,482 | * 6/1989 | Kreifels et al. | 365/185.22 |
| 4,860,261 | * 8/1989 | Kreifels et al. | 365/185.18 |
| 4,862,459 | * 8/1989 | Fukushima | 714/721 |
| 5,025,344 | * 6/1991 | Maly et al. | 361/88 |
| 5,117,426 | * 5/1992 | McAdams | 714/721 |
| 5,155,844 | 10/1992 | Cheng et al. . | |
| 5,274,778 | * 12/1993 | Hall | 365/185.21 |
| 5,309,446 | * 5/1994 | Cline et al. | 714/718 |
| 5,339,273 | 8/1994 | Taguchi . | |
| 5,400,343 | * 3/1995 | Crittenden et al. | 714/721 |
| 5,428,621 | * 6/1995 | Mehrotra et al. | 714/721 |
| 5,469,393 | 11/1995 | Thomann . | |
| 5,544,108 | 8/1996 | Thomann . | |
| 5,577,051 | * 11/1996 | McClure | 714/721 |
| 5,594,696 | * 1/1997 | Komarek et al. | 365/208 |
| 5,659,550 | * 8/1997 | Mehrotra et al. | 714/721 |
| 5,818,268 | * 10/1998 | Kim et al. | 327/77 |
| 5,844,915 | * 12/1998 | Saitoh et al. | 714/719 |

FOREIGN PATENT DOCUMENTS 8-96597   4/1996   (JP) .

OTHER PUBLICATIONS

"Hardware Assisted Wire test for Standard Direct Random Access Memories and Daugther Cards," IBM Technical Disclosure Bulletin, vol. 38, No. 04, Apr. 1995.

* cited by examiner

Primary Examiner—Albert Decady
Assistant Examiner—Joseph D. Torres
(74) Attorney, Agent, or Firm—DeLio & Peterson, LLC; Robert Curcio; H. Daniel Schnurmann

(57) ABSTRACT

A Defect Leakage Screen Test apparatus and method is introduced to eliminate or reduce steps in the failure analysis process of memory devices, such as DRAM cells, or to eliminate the necessity for the application of a physical failure analysis on the memory device.

Special single bit failures due to leakage current, junction current, or threshold leakage current, are characterized by varying the p-well voltage of the memory device during the read operation of the test.

The p-well voltage is varied with a test code Initial Program Load (IPL). Additional logic is provided on the memory IC to decode the IPL logic signals.

In order to perform the p-well varying test, the memory device is provided with the following: IPL decoding logic; a reference voltage generator; an IPL voltage reference multiplexor; a p-well voltage feed-back circuit; and a differential amplifier circuit.

35 Claims, 7 Drawing Sheets

APPARATUS AND METHOD FOR PERFORMING A DEFECT LEAKAGE SCREEN TEST FOR MEMORY DEVICES

BACKGROUND OF THE INVENTION

1. Field of the Invention

The present invention relates to semiconductor devices and more specifically to dynamic memory devices, such as dynamic random access memory devices (DRAMs).

2. Description of Related Art

At the end of the testflow for every DRAM is the Burn-In module stress test and the Final module test. The purpose of these tests is to screen out all stress induced cell failures due to packaging and Burn-In. These tests perform a critical screening and characterization for memory cells, such as DRAM cells, which aid in identifying the retention time related failures at the module level. Retention time is determined by leakage current which has the effect of discharging the cell's high voltage or "1's" level to a lower voltage that makes it fail the read "1" operation. Leakage current occurs normally in DRAM cells, as predicted by semiconductor physics, but at sufficiently low values that correspond to retention times of several seconds. Present day DRAMs are tested and guaranteed for retention times of typically 128 milliseconds. This much shorter retention time provides margin for leakage currents higher than normal, and may allow for retention times between the specification value and the normal time of several seconds. These cells are considered weak and are potential reliability problems. It is desirable to design test methods which can identify and monitor these cells for degradation after stress. The identification of these cells is accomplished by signal margin testing.

The purpose of signal margin testing is to identify cells on the chip which are weaker than all other cells on the chip. These weaker cells are usually the result of defects. Although a weaker cell may function normally under typical operating conditions after initial fabrication, it may degrade with time or stress, and later fail after module assembly or after burn-in stress testing, or in a customer application.

Current test methods, however, typically require several thorough and in-depth analyses in order to identify the exact failure mechanisms. As technology advances, the number of memory cells of a memory device increases, requiring more time to test the memory, to detect defective bits, and afterwards, to characterize their failure mechanisms. The defective modules are then analyzed during the Physical Failure Analysis (PFA) to identify the failure mechanisms and any root causes. The PFA, however, is a very thorough but time consuming process. A major productivity enhancement can be achieved by providing the PFA analyst more detailed data about the expected failure mechanisms and failure classifications.

Conventional methods to characterize retention related failures include operating a set of test patterns on the whole memory array, and varying the refresh cycle time. Any leakage current in the device will cause a decrease of charge in the memory cell, and hence, reduce the retention time. FIG. 1 depicts the cross-section of an n-polysilicon memory cell 10 with a p-well 12 and an NFET Array Device 14 and Wordline (WL) 16. The contact area of the memory cell's n-polysilicon 10 and the plate voltage area 18 form a cell capacitor. The p-well voltage is held at a negative potential and forms the back bias of the array device. It has an electrical connection via the p-well contact 26. Typically, two leakage currents can be established, junction leakage 20, $I_{jct}$, and subthreshold leakage 22, $I_{sub}$. The junction leakage is formed between the pn-junction of the p-well 12 and the n-diffusion 14 of the cell. The subthreshold leakage represents the current between the bitline 24 and the cell when the array is turned off, i.e., the wordline 16 potential is at zero volts. Any change in the back bias voltage (p-well voltage) will affect the two described leakage currents.

Thus, the ability to characterize retention related single bit failures remains a challenge in the art that has, to date, been performed by inefficiently varying the refresh cycle time of the device.

Special test conditions activated by a test code are taught in U.S. Pat. Nos. 5,469,393 and 5,544,108, issued to M. Thomann on Nov. 21, 1995 and Aug. 6, 1996, respectively. The first test condition connects the bit lines of the unselected half of a shared sense amp array to the bit lines of the selected half to produce twice the bit line capacitance and consequently half of the 'read' signal level. A second method reduces the 'read' margin by adjusting the cell capacitor plate voltage which can lower the logic level "1", or raise the logic level "0" node voltage in the cell with respect to the bit line read reference voltage level. A third method teaches higher bit line capacitance connected to an external capacitance via test mode switches or an external read reference voltage connected by the same switches. Such similar methods are taught by Taguchi in U.S. Pat. No. 5,339,273, issued on Aug. 16, 1994.

These signal margin test methods can identify cells which have weaker read output charge than other cells. Weaker read output charge can be the result of several possible defects or abnormalities within the cell, such as high junction leakage current, high sub-threshold current, parasitic leakage paths, low cell capacitance, and high connection resistance. It remains difficult under the prior art test methods to ascertain which defect caused the failure.

Bearing in mind the problems and deficiencies of the prior art, it is therefore an object of the present invention to provide a test apparatus and methodology to characterize special single bit failures, cell retention time failures, due to leakage current, junction leakage current, or sub-threshold leakage current.

It is another object of the present invention to provide a test apparatus and methodology to perform a package level screen test that distinguishes between different failure mechanisms for packaged memory devices.

It is yet another object of the present invention to provide a test apparatus and methodology to shorten the test time for retention of related cell failures in the testing of memory devices.

Still other advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a defect leakage screen test apparatus adapted to regulate a p-well voltage of a semiconductor memory device, comprising: a tester adapted to provide initial program load logic signals; and, the semiconductor memory device having logic circuitry comprising: an initial program load decoding logic circuit, having decoding input signals and decoding output signals, adapted to decode the initial program load logic signals; a reference voltage generator circuit; an initial program load voltage reference multiplexor circuit; a p-well voltage feed-back circuit; and, a differential amplifier circuit.

The initial program load decoding logic circuit comprises: a plurality of NAND gates; and, a plurality of inverter gates; wherein logic combinations of the decoding input signals are adapted to activate different logic outputs of the decoding output signals.

The reference voltage generator circuit comprises: a voltage divider network for reducing internal voltage signals and peripheral circuitry voltages, in reference to a ground voltage signal; and, a transistor in series with the voltage divider network. The voltage divider network comprises a plurality of resistors electrically connected in series.

The initial program load voltage reference multiplexor circuit comprises a first stage and a second stage, wherein the multiplexor circuit is adapted to select a plurality of voltage signals generated by the voltage reference generator and outputs the selected signals to the differential amplifier circuit.

The p-well voltage feed-back circuit comprises a voltage divider, having a voltage divider output signal, the voltage divider connected to an internal voltage signal and a p-well voltage signal, such that the voltage divider output signal is used as an input to the differential amplifier circuit.

The differential amplifier circuit, having more than one differential amplifier input signals and at least one differential amplifier output signal, is adapted to receive a reference voltage signal from the initial program load reference multiplexor circuit as one of the more than one differential amplifier input signals, and a voltage signal from the p-well voltage feed-back circuit as a second of the more than one differential amplifier input signals, is adapted to compare the reference voltage signal with the p-well voltage feed-back signal, and adapted to control activation of a p-well voltage pump through the differential amplifier output signal.

The present invention which is directed to, in a second aspect, an apparatus adapted to regulate p-well voltage, comprising: means for decoding electronic logic signals; means for generating reference voltage signals dependent upon the decoded logic signals; means for multiplexing the reference voltage signals; means for providing a p-well voltage signal; means for comparing the p-well voltage signal to the reference voltage signal; and, means for generating an output signal dependent upon the comparison.

The present invention which is directed to, in a third aspect, a test method to detect the leakage cause of cell retention time related failures of an integrated circuit memory device having a plurality of memory cells and a p-well voltage, comprising:

a) providing the integrated circuit memory device with logic circuitry capable of decoding initial program load instructions;

b) varying the p-well voltage for each of the memory cells during a memory cell read;

c) determining the pass/fail criteria of the retention time as a function of the varied p-well voltage for each of the memory cells;

d) grouping failures of the memory cells by different types of leakage current;

e) sending control signals to logic circuitry of the memory device through initial program load commands; and, f) monitoring and varying the p-well voltage of the memory device.

The step (f), monitoring and varying the p-well voltage further comprises: 1) feeding back the p-well voltage to a comparator circuit having at least two comparator inputs and at least one comparator output; 2) comparing the p-well voltage with a reference voltage during normal IC chip operation; and, 3) activating a voltage pump circuit based on the comparator output to vary the p-well voltage.

The present invention which is directed to, in a fourth aspect, a test method to detect retention time related failures of an integrated circuit memory device having a plurality of memory cells and a predetermined p-well voltage, comprising: a) writing to each of the plurality of memory cells with a logic bit; b) reading the logic bit, changing the p-well voltage during the read operation to measure at least two different leakage currents; and, c) generating a bit failure map to detect the memory cells with retention time problems based upon the at least two different leakage current measurements.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
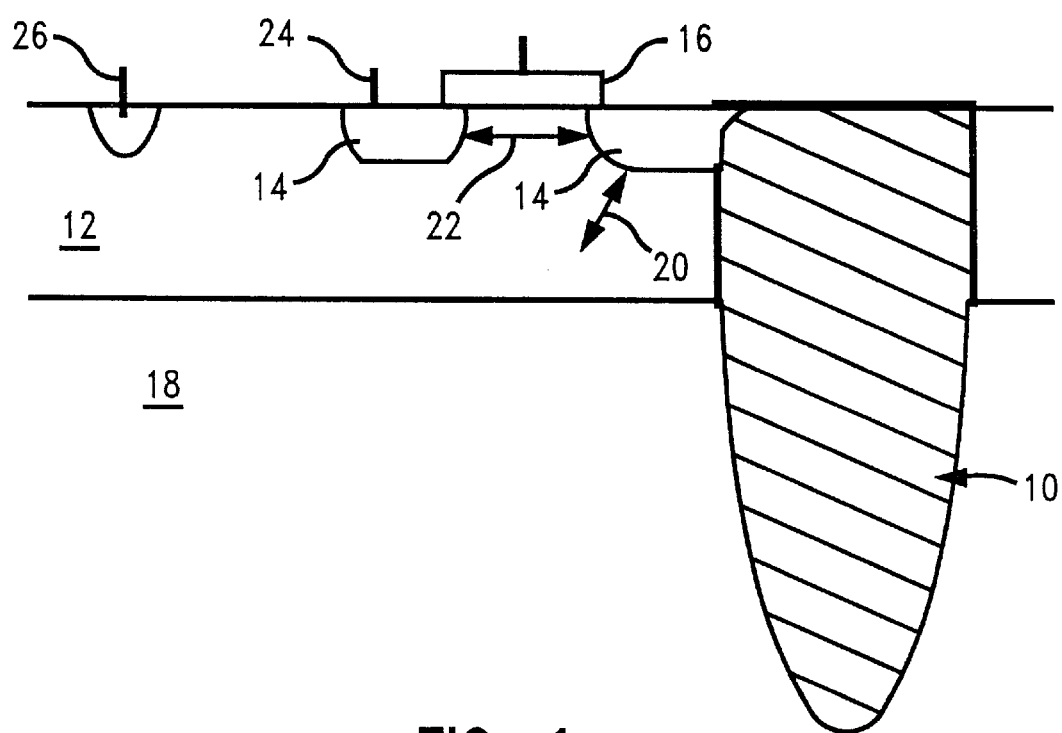
FIG. 1 is a cross-section of a memory cell with a p-well and an NFET array device.

In describing the preferred embodiment of the present invention, reference will be made herein to FIGS. 2–7 of the drawings in which like numerals refer to like features of the invention. Features of the invention are not necessarily shown to scale in the drawings.

A Defect Leakage Screen Test apparatus is introduced to eliminate or reduce steps in the failure analysis process of memory devices, such as DRAM cells, or to eliminate the necessity of a Physical Failure Analysis (PFA) in its entirety. The introduced test procedure is aimed to characterize special single bit failures due to leakage current, junction leakage current, or sub-threshold leakage current. Importantly, this test method can be applied at the package level. The test method employs a test mode initial program load (IPL) variation of the cell transfer device back-bias voltage or p-well voltage ($v_{bb}$). The ability to vary $v_{bb}$ makes it possible to identify which type of leakage is likely causing a cell to be weak or fail for retention time. An indication of junction leakage, $I_{jct}$, as the cause of the failure is determined by applying a lower (or more negative) value for $v_{bb}$ during the appropriate test patterns for retention time. A $v_{bb}$ that is more negative than normal operating conditions raises the transfer device threshold, lowering its sub-threshold current, $I_{sub}$, while at the same time increasing the p-n junction reverse bias, enhancing the junction leakage, $I_{jct}$. A $v_{bb}$ that is more positive would lower the threshold voltage, and, with test patterns that maximize the device OFF state, have the cell leakage current dominated by the sub-threshold current, $I_{sub}$.

First, the pass/fail criteria of the retention time as a function of the p-well voltage ($v_{bb}$) for each single cell is determined typically by running a Shmoo test pattern to create a Shmoo plot. A Shmoo test monitors a set of patterns of an output of a system under test by varying, incrementally, individual parameters of the system. Information regarding each of the different root causes of the single bit faults is acquired by a typical Shmoo plot. Hence, this first step in the test method facilitates grouping the single bit failures under different categories and distinguishing between different types of leakage mechanisms and failures of unknown origins.

Key to this test procedure is the ability to vary the p-well voltage, $v_{bb}$, at the module level with a test code Initial Program Load (IPL). This is accomplished by implementing additional logic on the integrated circuit chip which can be activated by the test equipment's IPL code.

Figure 2:
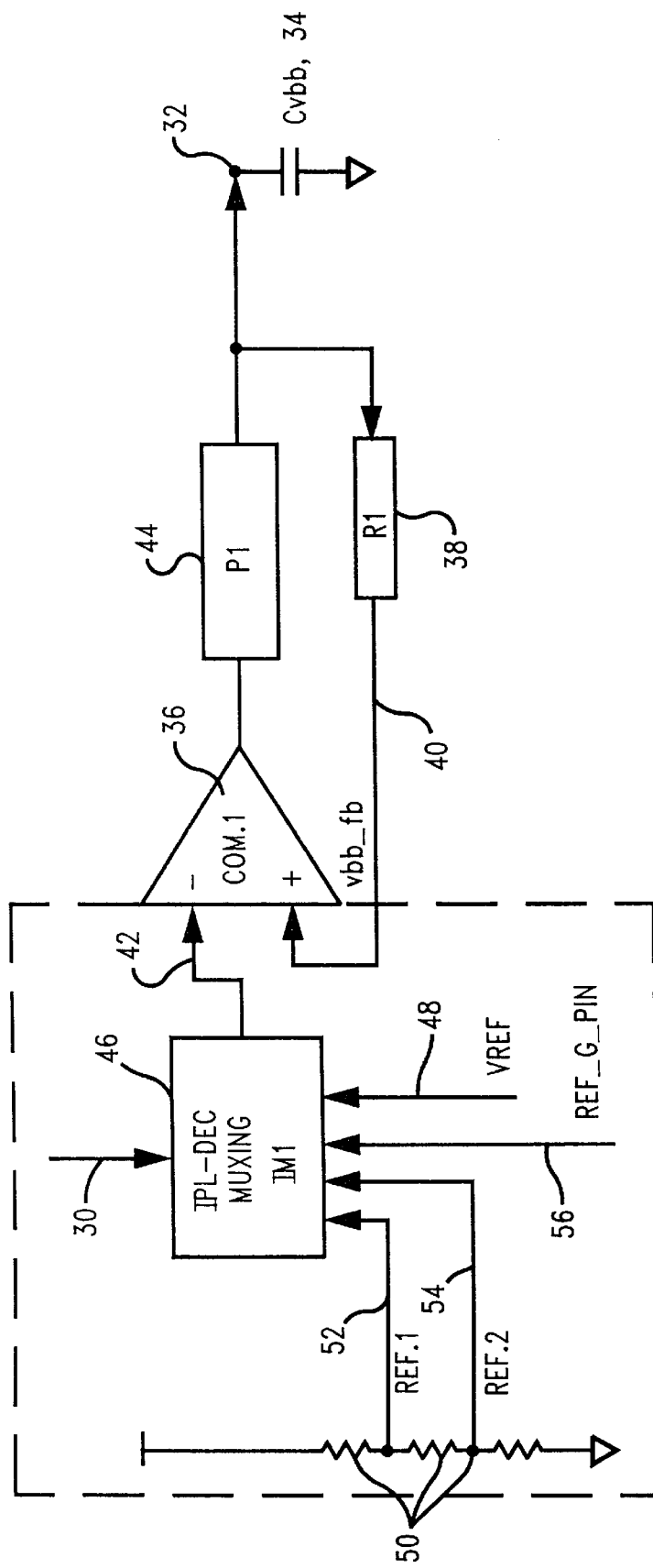
FIG. 2 is a functional block diagram of an electrical circuit for varying the p-well voltage through the IPL.

FIG. 2 illustrates the electronics, in block diagram form, for changing the p-well voltage using a variable $v_{bb}$ adjustment through the tester's IPL signals 30.

The principal function of the p-well voltage variation system is as follows: the $v_{bb}$ voltage at node 32 or the (p-well) voltage at the NET (drawn as capacitor $C_{vbb}$, 34) having voltage $V_{bb\_net}$ is monitored and fed back to a comparator 36 (COM1) through a resistor divider R1, 38. The output voltage of R1, feed back voltage 40, $v_{bb\_fb}$, is compared with a reference voltage 42, $v_{ref}$, during normal chip operation, and the $v_{bb}$ pump 44, P1, is activated if the voltage level of $v_{bb}$ 32 decreases with respect to $v_{ref}$ 42 thus maintaining the desired $v_{bb}$ voltage level.

The $v_{bb}$ voltage 32 is adjusted to a different level by changing the reference voltage $v_{ref}$ 42 with respect to the comparator COM1 36. This allows the regulation of the $v_{bb}$ voltage 32 to be activated for two conditions:

a) regulation from −1 V to other lower voltage levels, e.g., −1.5 V, performed by charging $v_{bb\_net}$ 34 with $v_{bb}$ pump 44; or, b) regulation from −1 V to other higher voltage levels, e.g., 0V, performed by discharging $v_{bb\_net}$ 34 with a leakage current.

In both cases, however, the time constant required to reach the final voltage level must be considered.

The design implementation of the test code is accomplished by providing a set of different reference voltages to the comparator input, depending upon the internal test code signals 30. The test code signals are decoded in the IPL-DEC IM1 circuit 46 and the appropriate reference voltage 42 then gets multiplexed to the comparator 36 input. FIG. 2 shows three different sources for the reference voltages:

a) a global voltage reference 48, $V_{REF}$, sets the default value for the p-well voltage level;

b) a resistor divider 50 generates different reference voltage levels, REF1 and REF2, (52 and 54, respectively) dependent upon the decoded test signals; or, c) a test code controlled reference voltage that can be supplied, e.g., via the G-pin (Ref_g_pin) 56.

Figure 3:
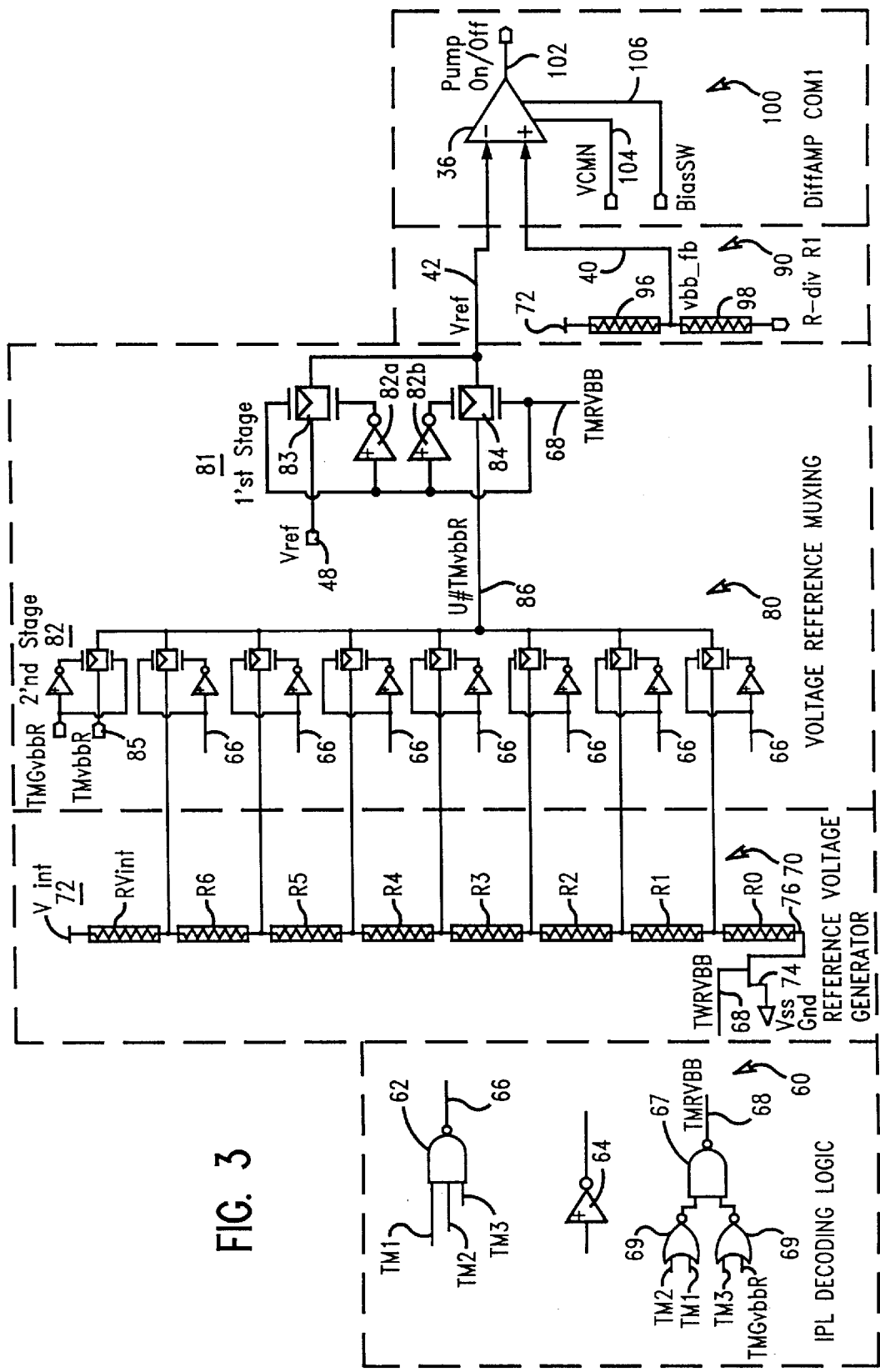
FIG. 3 is a schematic of the embodiment of this defect leakage screen test apparatus ($v_{bb}$ regulation system).

FIG. 3 is a schematic of the embodiment of this $v_{bb}$ regulation device. This regulation device can be differentiated into five functional parts: 1) IPL decoding logic 60; 2) a reference voltage generator 70; 3) an IPL voltage reference multiplexor 80; 4) $v_{bb}$ feed-back circuit 90; and, 5) a differential amplifier circuit 100.

IPL Decoding Logic

The IPL Decoding Logic 60 consists of seven NAND3 gates 62, and three inverter gates (INV) 64. The three IPL input signals TM1, TM2, and TM3, typically delineated as TM<1:3>, are decoded such that one out of seven output signals VRMX<0:6> 66 is activated. Table I identifies the IPL decoding logic.

TABLE I

| IPL DECODING LOGIC | | | |
|---|---|---|---|
| TM1 | TM2 | TM3 | VRMX(#) |
| 0 | 0 | 0 | Vrefdc |
| 0 | 0 | 1 | 0 |
| 0 | 1 | 0 | 1 |
| 0 | 1 | 1 | 2 |
| 1 | 0 | 0 | 3 |
| 1 | 0 | 1 | 4 |
| 1 | 1 | 0 | 5 |
| 1 | 1 | 1 | 6 |

The decoded signals, VRMX(#) 66, control the Voltage Reference Multiplexor block. If one of the IPL signals, TM1, TM2, or TM3, or TMGv$_{bb}$R is active, the signal TMRv$_{bb}$ 68 will go to a logic high, turning the Reference Voltage Generator ON and switching the second Multiplexor stage within the Voltage Reference Multiplexor Circuit. The signals TM<1:3> and TMGv$_{bb}$R are logically analyzed through NOR gates 69 and provide inputs to a NAND gate 67.

Reference Voltage Generator

The Reference Voltage Generator function 70 may be performed with eight resistors (R0–R6) and Rvint connected in series. The resistors act as a voltage divider network between the internal voltage level (Vint) 72, an internal voltage for peripheral circuits, and $V_{ss}$ or Ground Voltage (GND). Also in series with the resistors is an NFET MOS Transistor 74 with its source connected to $V_{ss}$ and drain 76 connected to the series resistor R0. The gate of this transistor is controlled by the TMRV$_{bb}$ 68 signal and turns ON the current path through the resistor when signal TMRV$_{bb}$ 68 equals a logic "1" voltage level, or turns OFF the current path when signal TMRV$_{bb}$ equals a logic "0" voltage level. The generated voltage levels U# (U0–U6) are calculated according to the voltage divider formula:

$$U\# = (R\#/R_{total}) * U_{total}$$

where, $U_{total} = V_{int} - GND$, in volts $R_{total} = R0 + R1 + \ldots + Rv_{int}$, in ohms R# = Resistance between U# and GND, in ohms.

IPL Voltage Reference Multiplexor

The multiplexing of different voltage levels (U#) from the voltage generator to the comparator (COM1) 36, is done in two stages. In the first stage is a 2:1 multiplexor 81 having two inverters $I_{inv1}$ 82a, $I_{inv2}$ 82b, and two pass gates $I_{pg1}$ 83, and $I_{pg2}$ 84. If the IPL is not active, the global reference voltage $V_{REF}$ 48 is multiplexed to COM1 36. The second stage 82 is an 8:1 multiplexor dependent upon the decoded IPL signals VRMX# or the IPL signal TMGvbbR, generated in the IPL Decoding Logic Block 60. If one or more of the IPL signals TM1, TM2, TM3, or the IPL signal TMGvbbR is active, the voltage U<0:6> or TMvbbR 85 is multiplexed to the second stage to the node U#TMvbbR 86 and through the first stage 81 to node $V_{ref}$ 42, which is the input of the differential amplifier COM1 36. The reference voltage TMvbbR 85 is not generated internally on the integrated circuit chip, but is forced externally through the G-PIN.

Vbb Feed-back Circuit

The $v_{bb}$ voltage level is detected and fed back through two resistors, acting as a voltage divider 90, between the internal voltage $v_{int}$ 72 and the $v_{bb}$ voltage 32. The signal $v_{bb\_fb}$ 40 is connected between the two resistors $Rv_{int}$ 96 and $Rv_{bb}$ 98, and is electrically connected to the input of the differential operational amplifier COM1 36.

Differential Amplifier Circuit

The differential amplifier circuit 100, having comparator COM1 36, compares the reference voltage $V_{ref}$ 42 with the $v_{bb}$ feed-back voltage, $v_{bb\_fb}$ 40, and controls the activation of the $v_{bb}$ pump 44 through comparator output signal PumpOnOff 102. If the reference voltage $V_{ref}$ 42 is higher than the feed back voltage, $v_{bb\_fb}$ 40, the output signal PumpOnOff 102 is low (logic level 0) which means the pump is OFF. Conversely, if the reference voltage level is lower than the feed back voltage, the output signal PumpOnOff is high (logic level 1) the pump is in the ON state. In FIG. 3, the signal $v_{CMN}$ 104 is the common mode reference voltage and the signal BiasSW 106 represents a signal from a switch for activating the differential amplifier.

The advantage of applying the present invention to detect retention related failures by varying the p-well voltage is shown in an example for a Multiple Read Ripple BIT (MRRB) test flow. The MRRB test is used to detect single cell failures due to retention time problems of the cell. Therefore, after the complete memory has been written, each bit (single cell) is read repeatedly up to sixty four times. The plate voltage (p-well voltage) $V_{bb}$ is held at a constant voltage level $V_{nom}$ during the entire test. $V_{nom}$ is the nominal $v_{bb}$ voltage level during chip operation. The test result can be a BIT Fail Map which shows the failing cells. The testing time to detect failures with this method is considerably long.

Figure 4:
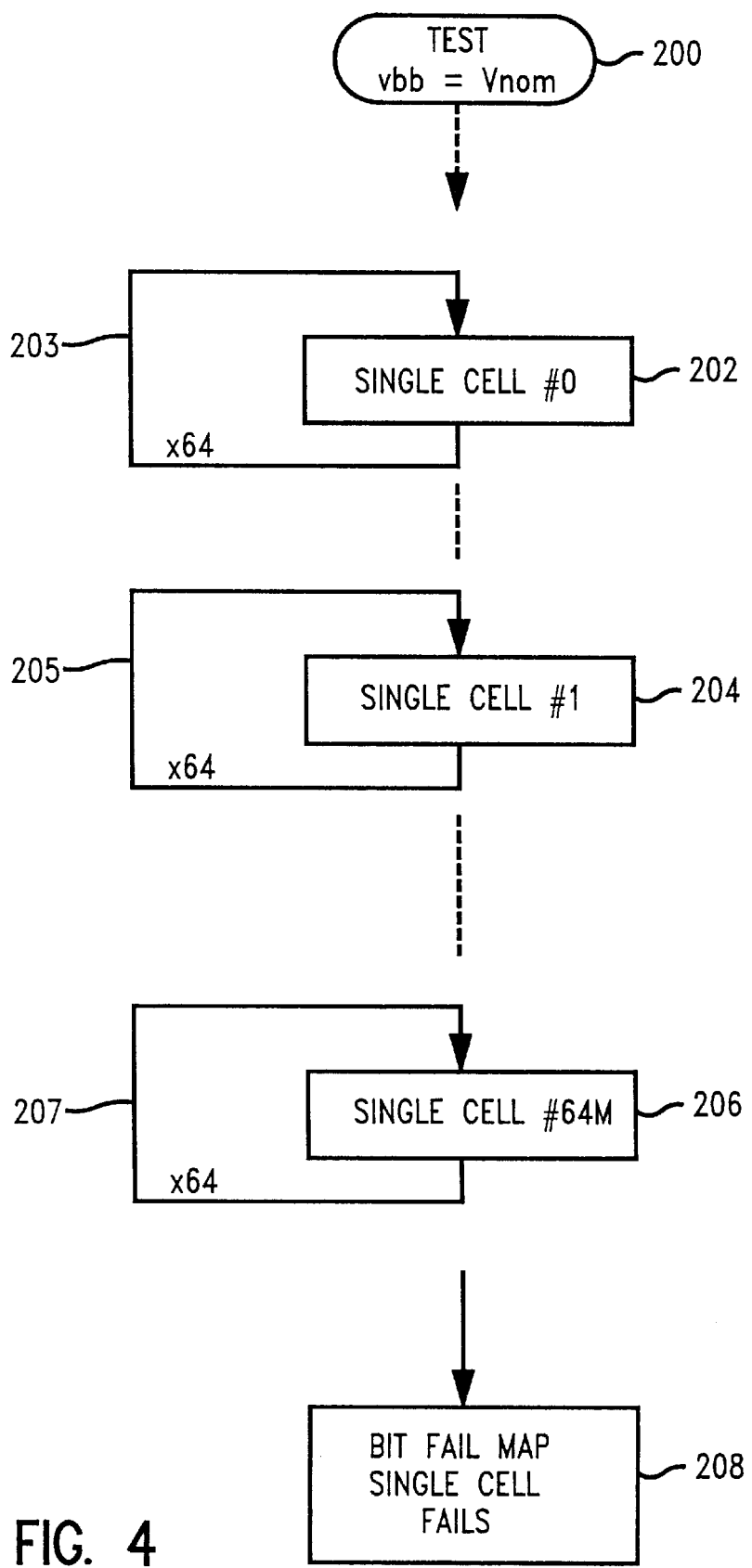
FIG. 4 is a flow chart for determining a bit fail map for a memory device.

Conventionally, referring to FIG. 4, the test voltage $v_{bb}$ is set to $V_{nom}$ 200. Single cell #0 is then read 202, and repeated sixty four times 203. Next, single cell #1 is read 204, and repeated sixty four times 205. This activity is continuously performed until single cell #64 is read 206, and repeated sixty four times 207. The failure of a single cell of the BIT map is then determined 208 from the previous READ steps.

The method of changing vbb voltage level during the READ operation allows detection of a memory cell which has a retention time problem due to subthreshold leakage or junction leakage in a significant shorter amount of test time. The principal test function remains the same as in the conventional method, however, the readouts for each single cell is reduced from sixty four to four.

Figure 5:
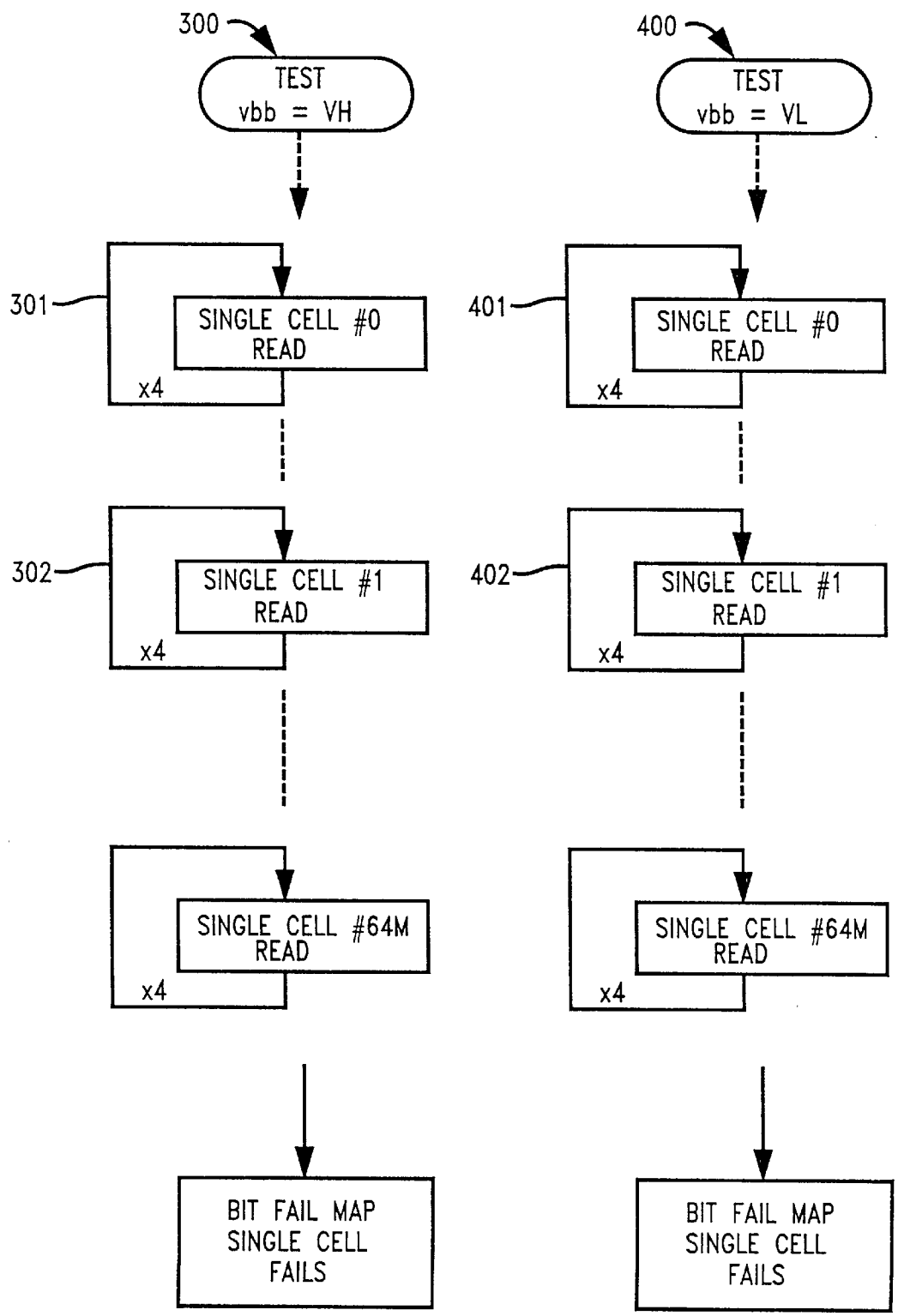
FIG. 5 is a flow chart for the test flow of detecting single cell failures by varying the p-well voltage.

FIG. 5 depicts the test flow for the instant method. Two paths are taken, one where the p-well voltage is at a logic high ($V_H$) 300, and the other where it is at a logic low ($V_L$) 400. In both cases the single cells #0–#64M are read 301, 302, 401, and 402, however there is only a repeat READ of four, not sixty four. Thus, a reduction in test time (efficiency) can be realized by implementation of this new technology.

Dependent upon the failure mechanism (subthreshold or junction leakage) a higher $V_H$ (more positive) or lower $V_L$ (more negative) $v_{bb}$ voltage level is then applied. The new voltage levels $V_H$, $V_L$ are defined through empirical data and based on Shmoo test patterns.

By increasing the $v_{bb}$ level to higher values, the sub-threshold leakage current will increase, whereas, by reducing the $v_{bb}$ to lower levels, the junction leakage will be the failure cause. Based on the empirical data, the $V_H$ and $V_L$ $v_{bb}$ levels can be used to set a guard band for the two different leakage currents.

Figure 6:
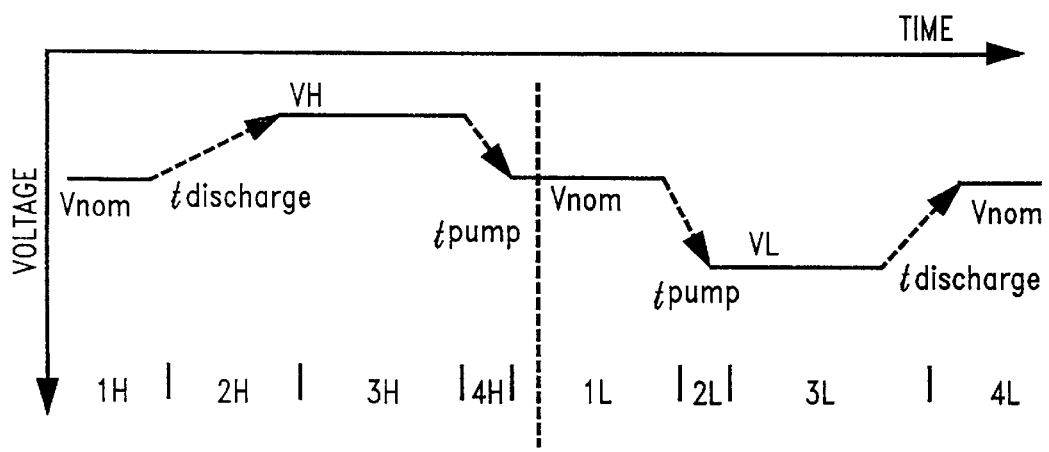
FIG. 6 is a time line for indicating the varying p-well voltage at discrete time intervals.
Figure 7:
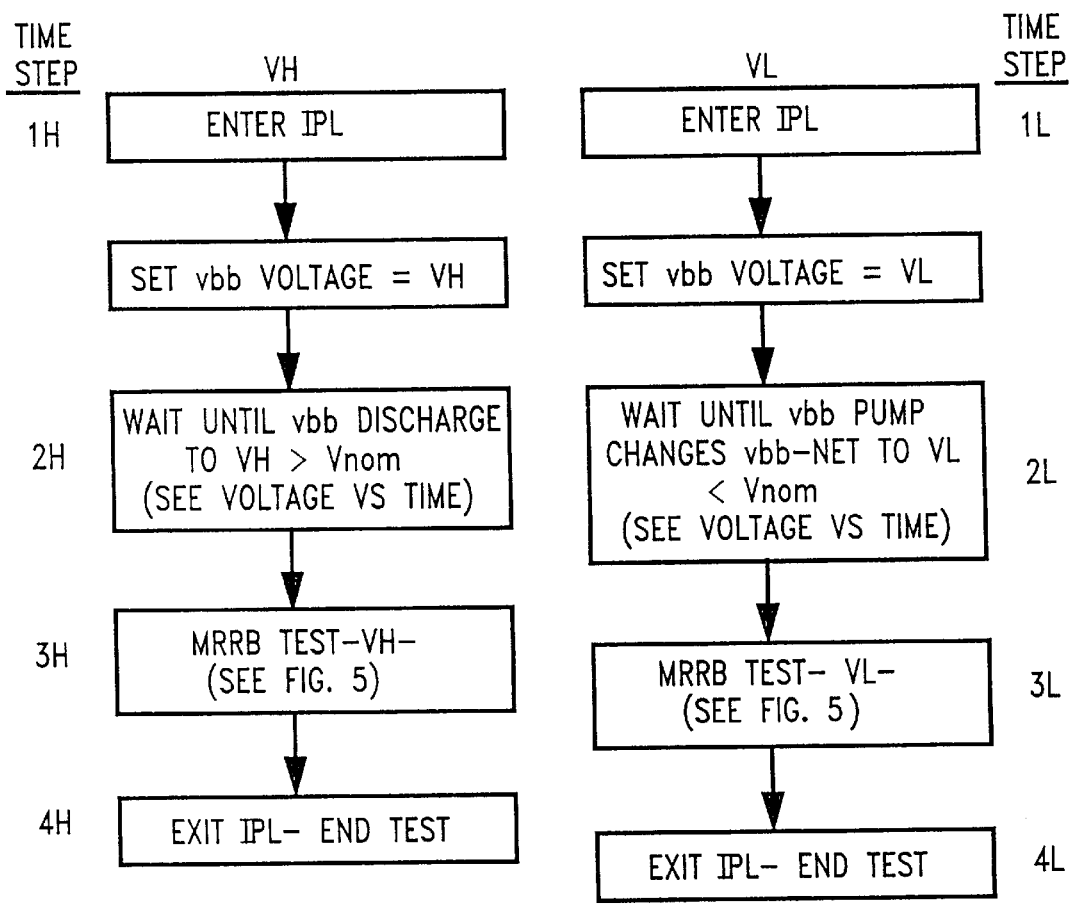
FIG. 7 is a flow chart depicting the test methodology steps at the discrete time intervals of FIG. 6.

FIG. 6 shows the vbb voltage as a function of time intervals 1H–4H and 1L–4L for the $V_H$ and $V_L$ test flows, respectively. The corresponding test flow diagram for the voltage versus time curve of FIG. 6 is indicated in FIG. 7. Based on the information contained in these figures, a calculation for the timing requirements for the two test methods can be performed, as shown in Table II, below.

TABLE II

Test Timing Requirement Calculations per 64M Chip

| Time Step | Improved Test Method | Conventional Test Method |
| --- | --- | --- |
| 1. Enter IPL | time requirement is included in time step 2 | Not necessary. |
| 2H Discharge $v_{bb}$ | C = 100 nF; V = 1 V, I = 1 $\mu$A; t = 100 to 150 ms | Not necessary. |
| 2L charge $v_{bb-net}$ | C = 100 nF; V = 1 V, I = 1 mA; t = 0.1 ms | |
| 3. MRRB Test Time trc = 110 ns | # reads = 4 x16: (110 ns * 4) * 64M/16 = 30 s x8: (110 ns * 4) * 64M/8 = 60 s x4: (110 ns * 4) * 64M/16 = 120 s | # reads = 64 x16: 120 s x8: 240 s x4: 480 s |
| 4H Charge | C = 100 nF; V = 1 V, I = 1 mA; t = 0.1 ms | Not Necessary |
| 4L Discharge | C = 100 nF; V = 1 V, I = 1 $\mu$A; t = 100 to 150 ms | |

As indicated in the test flow diagram, FIG. 6, the Initial Program Load (IPL) mode or test mode is activated with a defined entry sequence.

The calculation for the READOUT time, shown in Table II, depends on the I/O configuration (x16, x8, or x4), the number of reads, and the cycle time $t_{rc}$.

Referring to FIGS. 6 and 7 for the time segments 1 through 4 (1H–4H and 1L–4L in FIG. 6), four discrete steps are progressed:

1. The IPL mode or test mode is activated with a defined entry sequence. The p-well voltage ($v_{bb}$) is at a nominal voltage level. (t=1H, 1L)

2. Dependent upon the activated test mode, the $v_{bb\_net}$ gets discharged through the resistor divider circuit of the feed-back path (t=2H) to $V_H$ with a discharge current of approximately 1 $\mu$A, or the $v_{bb\_net}$ gets charged (t=2L) to $V_L$ by activating the $v_{bb}$ pump with a charge current of approximately 1 mA; the required times being as indicated in Table II.

3. Once the voltage level $V_L$ or $V_H$ is reached the MRRB test is performed. (t=3H or 3L)

4. The test mode is then exited and the voltage is allowed to reach the default or nominal value in the appropriate time indicated in Table II.

The timing requirement calculation shows that the test method testing time is significantly decreased as a result of implementing this methodology, and is mainly dependent upon the number of readouts per cell. The charging and discharging of the p-well $v_{bb\_net}$ voltage requires significant less test time than the MRRB test itself.

The present invention is given for technology with an NFET array device in a p-well, however, the technology and implementation of the method and apparatus described herein is also applicable for an n-well with a PFET array device. Such an implementation would require different voltage levels, but the principal of variable back-bias voltage remains consistent and unchanged.

The present invention, through the grouping of single bit failures of memory devices based on varying the p-well junction, provides a test apparatus and methodology for facilitating the characterization of single bit failures due to leakage current, junction current, or threshold leakage current. It allows the test operator to distinguish between different failure mechanisms for the packaged memory devices, thereby shortening the test time for retention related failures.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A defect leakage screen test apparatus for regulating a p-well voltage of a semiconductor memory device, comprising:
   a tester adapted to provide initial program load logic signals; and,
   a semiconductor memory device having logic circuitry comprising:
      an initial program load decoding logic circuit, adapted to decode input signals and decoding output signals, for decoding said initial program load logic signals such that, when one of said input signals is active, a reference voltage generator circuit is turned on, and a second multiplexor stage within the initial program load voltage reference multiplexor circuit is switched on;
      said reference voltage generator circuit comprising a voltage divider circuit for creating a reference voltage by generating a voltage level between an internal voltage and a ground voltage;
      said initial program load voltage reference multiplexor circuit adapted to multiplex different voltage levels from said reference voltage generator circuit, said multiplexor comprising a first multiplexor stage and said second multiplexor stage;
      a p-well voltage feed-back circuit detecting a back-bias voltage of said semiconductor memory device, and voltage dividing the detected back-bias voltage with a voltage divider circuit;
      a voltage pump activated to increase said back-bias voltage when said back-bias voltage decreases with respect to said reference voltage; and
      a differential amplifier circuit comparing said detected back-bias voltage to said reference voltage, and controlling activation of said voltage pump.

2. The apparatus of claim 1 wherein said initial program load decoding logic circuit comprises:
   a plurality of NAND gates; and,
   a plurality of inverter gates;
      wherein logic combinations of said decoding input signals activate different logic outputs of said decoding output signals.

3. The apparatus of claim 2 wherein said decoding output signals control reference voltages for said reference voltage generator circuit.

4. The apparatus of claim 2 wherein said decoding input signals may be electronically analyzed through at least one NOR gate and at least one NAND gate: said at least one NOR gate providing input to said at least one NAND gate.

5. The apparatus of claim 1 wherein said reference voltage generator circuit comprises:
   a voltage divider network adapted to reduce internal voltage signals and peripheral circuitry voltages, in reference to a ground voltage signal; and,
   a transistor in series with said voltage divider network.

6. The apparatus of claim 5, wherein said transistor further comprises a source, a gate, and a drain; said source electrically connected to said ground voltage, said drain electrically connected to said voltage divider network, and said gate controlled by an output signal of said decoding logic circuit.

7. The apparatus of claim 5 wherein said voltage divider network comprises a plurality of resistors electrically connected in series.

8. The apparatus of claim 6 wherein said gate is adapted to activate a current path through said voltage divider network when said decoding logic output signal is at a logic HIGH voltage level, and said gate may turn off said current path through said voltage divider network when said decoding logic output signal is at a logic LOW voltage level.

9. The apparatus of claim 5 wherein a plurality of voltage signals generated by said voltage divider network are input signals into said voltage reference multiplexor circuit.

10. The apparatus of claim 1 wherein said initial program load voltage reference multiplexor circuit comprises a first stage and a second stage, wherein said multiplexor circuit is adapted to select a plurality of voltage signals generated by said voltage reference generator and adapted to output the selected signals to said differential amplifier circuit.

11. The apparatus of claim 10 wherein said first stage comprises two inverters and two pass gates, such that said inverters and pass gates form a 2:1 multiplexor.

12. The apparatus of claim 10 wherein said second stage comprises a plurality of inverters and a plurality of pass gates.

13. The apparatus of claim 12 wherein said second stage comprises eight inverters and eight pass gates, such that said second stage forms an 8:1 multiplexor.

14. The apparatus of claim 1 wherein said p-well voltage feed-back circuit voltage divider comprising a voltage divider output signal, said voltage divider connected to an internal voltage signal and a p-well voltage signal, such that said voltage divider output signal is used as an input to said differential amplifier circuit.

15. The apparatus of claim 14 wherein said voltage divider comprises two resistors in series.

16. The apparatus of claim 1 wherein said differential amplifier circuit, having more than one differential amplifier input signals and at least one differential amplifier output signal receives a reference voltage signal from said initial program load reference multiplexor circuit as one of said more than one differential amplifier input signals, and a voltage signal from said p-well voltage feed-back circuit as a second of said more than one differential amplifier input signals, said differential amplifier circuit compares said reference voltage signal to the p-well voltage feed-back signal, and controls activation of a p-well voltage pump through said differential amplifier output signal.

17. The apparatus of claim 16 wherein said control of said p-well voltage pump comprises a first logic voltage level for said differential amplifier output signal when the level of the reference voltage signal is higher than the level of the p-well voltage feed-back signal, and a second logic voltage level for said differential amplifier output signal, different than said first logic voltage level, when the level of the reference voltage signal is lower than the level of the p-well voltage feed-back signal.

18. An apparatus for regulating p-well voltage, comprising:

means for decoding electronic logic signals;
means for generating reference voltage signals dependent upon the decoded logic signals such that, when one of said decoded logic signals is active, a reference voltage generator circuit is turned on, and a second multiplexor stage with a voltage reference multiplexor circuit is switched on;
means for multiplexing said reference voltage signals;
means for providing a p-well voltage signal;
means for comparing said p-well voltage signal to said reference voltage signal by detecting a back-bias voltage and voltage dividing said detected back-bias voltage; and,
means for generating an output signal dependent upon the comparison, said output signal generated by a voltage pump activated to increase said back-bias voltage when said back-bias voltage decreases with respect to said reference voltage signal.

19. A package level leakage current characterization apparatus for test code modulation of memory cell back-bias voltage, comprising:

an initial program load decoding logic circuit adapted to decode input signals and decode output signals, wherein logic combinations of said decoding input signals activate different logic outputs of said decoding output signals;
a reference voltage generator circuit having a voltage divider network adapted to reduce internal voltage signals and peripheral circuitry voltages with
reference to a ground voltage signal, and a transistor in series with said voltage divider network;
an initial program load voltage reference multiplexor circuit having a first stage and a second stage, wherein said multiplexor is adapted to select a plurality of voltage signals generated by said voltage reference generator and adapted to output the selected signals to a differential amplifier circuit;
a back-bias voltage feed-back circuit comprising a back-bias voltage divider having a voltage divider output signal, said voltage divider connected to a reference voltage signal and a back-bias voltage feed-back signal, such that said voltage divider output signal is used as an input to said differential amplifier circuit; and,
said differential amplifier circuit, having two differential amplifier inputs and a differential amplifier output, said differential amplifier inputs receive a reference voltage signal from said initial program load reference multiplexor circuit and a voltage signal from said back-bias voltage feed-back circuit, compares the reference voltage signal with the back-bias voltage feed-back signal, and controls activation of a back-bias voltage pump through said differential amplifier output such that leakage current is modulated by altering said back-bias voltage of said package.

20. The apparatus of claim 19 wherein said initial program load decoding logic circuit further comprises a plurality of NAND gates, and a plurality of inverter gates.

21. The apparatus of claim 19 wherein said voltage divider network comprises a plurality of resistors electrically connected in series.

22. The apparatus of claim 19 wherein said first stage comprises two inverters and two pass gates, such that said inverters and pass gates form a 2:1 multiplexor, and said second stage comprises a plurality of inverters and a plurality of pass gates, such that said second stage inverters and pass gates form an 8:1 multiplexor.

23. The apparatus of claim 19 wherein said back-bias voltage divider comprises two resistors in series.

24. The apparatus of claim 19 wherein control of said back-bias voltage pump is adapted to generate a logic LOW voltage level for said differential amplifier output signal when the level of said reference voltage signal is higher than the level of said back-bias voltage feed-back signal, and adapted to generate a logic HIGH voltage level for said differential amplifier output signal when the level of said reference voltage signal is lower than the level of said back-bias voltage feed-back signal.

25. The apparatus of claim 24 further comprising a bias signal adapted to activate said differential amplifier.

26. The apparatus of claim 24 wherein said differential amplifier comprises a comparator integrated circuit chip.

27. A test method to detect the leakage current of cell retention time related failures of an integrated circuit memory device having a plurality of memory cells and a p-well voltage, comprising:

a) providing said integrated circuit memory device with logic circuitry capable of decoding initial program load instructions;
b) varying said p-well voltage for each of said memory cell during a memory cell read;
c) determining the pass/fail criteria of the retention time as a function of the varied p-well voltage for each of said memory cells;
d) grouping failures of said memory cells by different types of leakage current;
e) sending control signals to logic circuitry of said memory device through initial program load commands; and,
f) modulating a sub-threshold leakage current and a junction leakage current through the monitoring and varying of said p-well voltage of said memory device.

28. The method of claim 27 wherein said step (f), monitoring and varying said p-well voltage comprises:

1) feeding back said p-well voltage to a comparator circuit having at least two comparator inputs and at least one comparator output;
2) comparing said p-well voltage with a reference voltage during normal IC chip operation; and,
3) activating a voltage pump circuit based on said comparator output to vary said p-well voltage.

29. The method of claim 28, wherein said step (2), comparing said p-well voltage, further comprises regulating said p-well voltage such that if said p-well voltage level decreases with respect to a reference voltage input to said comparator, said p-well voltage is regulated by changing said reference voltage.

30. The method of claim 28, wherein said step (3), activating a voltage pump circuit, further comprises the steps of:

i) varying said p-well voltage from −1 volt to lower voltage levels by charging a capacitor in said p-well voltage circuit with said voltage pump; and,
ii) varying said p-well voltage from −1 volt to higher voltage levels by discharging a capacitor in said p-well voltage circuit with a leakage current.

31. The test method of claim 27, wherein the leakage cause of cell retention time related failures includes sub-threshold leakage current and cell junction leakage.

32. A test method to detect retention time related failures of an integrated circuit memory device having a plurality of memory cells and a predetermined p-well voltage, comprising:
- a) writing to each of said plurality of memory cells with a logic bit;
- b) reading said logic bit, changing said p-well voltage during the read operation to measure a sub-threshold leakage current and a junction leakage current; and,
- c) generating a bit failure map to detect said memory cells with retention time problems based upon said leakage current measurements.

33. The method of claim 32 further comprising:
- d) using the changing p-well value result to set a guard band for said two different leakage current measurements.

34. The method of claim 32 wherein changing said p-well voltage comprises setting said p-well voltage for a logic HIGH voltage value and a logic LOW voltage value.

35. The method of claim 32 wherein reading said logic bit comprises performing a four-fold repeat read for each bit.

* * * * *